(12) United States Patent
Butcher et al.

(10) Patent No.: US 6,952,810 B2
(45) Date of Patent: Oct. 4, 2005

(54) CODING SPEED AND CORRECTNESS OF HARDWARE DESCRIPTION LANGUAGE (HDL) DESCRIPTIONS OF HARDWARE

(75) Inventors: Lawrence Butcher, Mountain View, CA (US); Krutibas Biswal, Mountain View, CA (US); Arvind Srinivasan, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 357 days.

(21) Appl. No.: 10/413,280

(22) Filed: Apr. 14, 2003

(65) Prior Publication Data

US 2003/0208739 A1 Nov. 6, 2003

Related U.S. Application Data

(60) Provisional application No. 60/376,706, filed on May 1, 2002.

(51) Int. Cl.$^7$ .............................................. G06F 17/50
(52) U.S. Cl. ............................................ 716/3; 716/18
(58) Field of Search .................... 716/2–3, 18; 710/305, 710/315

(56) References Cited

U.S. PATENT DOCUMENTS

| | | | |
|---|---|---|---|
| 6,631,470 B2 | * | 10/2003 | Chang et al. .................. 716/3 |
| 6,721,937 B2 | * | 4/2004 | Chard et al. .................. 716/18 |

* cited by examiner

*Primary Examiner*—Matthew Smith
*Assistant Examiner*—Paul Dinh
(74) *Attorney, Agent, or Firm*—Martine Penilla & Gencarella, LLP

(57) ABSTRACT

A method is provided, the method comprising collecting related signals capable of having unrelated names into a Krutibus, defining a bus capable of connecting the related signals in a bus definition file in the Krutibus and providing at least one of component declarations of the bus and different uses of the bus in a hardware description language (HDL) circuit description using the bus definition file in the Krutibus. The method also comprises providing a Krutibus preprocessor to read the hardware description language (HDL) circuit description for the at least one of the component declarations of the bus and the different uses of the bus and to generate a hardware description language (HDL) circuit description naming the bus components.

50 Claims, 12 Drawing Sheets

```
//    output    [22:0]addr_out;      // driven from flash
                                        controller to pads
//    output              cs_1_out;
//    output              oe_1_out;
//    output              wr_1_out;
//    output    [7:0]     data_out;
//    output              addr_out_oe_1;
//    output              cs_out_oe_1;
//    output              oe_out_oe_1;
//    output              wr_out_oe_1;
//    output              data_out_oe_1;
//    input     [7:0]     data_in;
```
⟵ 200

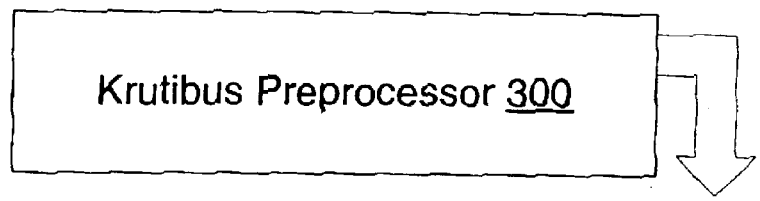

Krutibus Preprocessor 300

```
input     [22:0]  oc_flash_bus_addr_out;    // driven
                          from flash controller to pads
input             oc_flash_bus_cs_1_out;
input             oc_flash_bus_oe_1_out;
input             oc_flash_bus_wr_1_out;
input     [7:0]   oc_flash_bus_data_out;
input             oc_flash_bus_addr_out_oe_1;
input             oc_flash_bus_cs_out_oe_1;
input             oc_flash_bus_oe_out_oe_1;
input             oc_flash_bus_wr_out_oe_1;
input             oc_flash_bus_data_out_oe_1;
output    [7:0]   oc_flash_bus_data_in;
```
510

```
Collecting related signals capable of having unrelated names into a
Krutibus description    720
```

```
Defining a bus capable of connecting the related signals in a bus
definition file in the Krutibus description    730
```

```
Providing at least one of component declarations of the bus and
different uses of the bus in a hardware description language (HDL)
circuit description using the bus definition file in the Krutibus
description    740
```

```
Providing a Krutibus preprocessor to read the hardware description
language (HDL) circuit description for the at least one of the
component declarations of the bus and the different uses of the bus
and to generate a hardware description language (HDL) circuit
description naming the bus components    750
```

```
The Krutibus preprocessor needs to know what the particular hardware
description language (HDL) is that the Krutibus preprocessor is
preprocessing and the Krutibus preprocessor is capable of generating
respective source language to implement the bus in the particular
hardware description language (HDL)    860
```

```
The Krutibus preprocessor needs to know a direction the bus is
pointing and is capable of modifying the at least one of the component
declarations of the bus and the different uses of the bus depending on
the direction the bus is pointing    960
```

```
The bus definition file in the Krutibus description is capable of naming
subsets of the bus and the Krutibus preprocessor is capable of
preprocessing the subsets of the bus    1060
```

```
The Krutibus preprocessor is capable of performing assignments of the
bus and performing transformations to directions of the bus
components    1160
```

Figure 13

CODING SPEED AND CORRECTNESS OF HARDWARE DESCRIPTION LANGUAGE (HDL) DESCRIPTIONS OF HARDWARE

RELATED APPLICATION DATA

This patent application claims priority pursuant to 35 U.S.C. § 119(e) to U.S. provisional patent application Ser. No. 60/376,706, filed May 1, 2002, for IMPROVING CODING SPEED AND CORRECTNESS OF HARDWARE DESCRIPTION LANGUAGE (HDL) DESCRIPTIONS OF HARDWARE.

BACKGROUND OF THE INVENTION

1. Field of the Invention

This invention relates generally to computer software and, more particularly, to a method for describing computer hardware.

2. Description of the Related Art

Hardware description languages (HDLs) typically have "primitives" describing "wires" and "modules." Verilog is an example of a conventional hardware description language (HDL). However, modern computer hardware design is typically done using "busses" and not "wires." Verilog and other conventional Hardware description languages (HDLs) are typically poorly suited to modern computer hardware design done using "busses" and not "wires."

Conventional schematic-based hardware descriptions typically have a poor, but still useful, idea of a "bus." The typical bus as described in a conventional schematic consists of a bunch of signals with a single name and differing bit numbers. Some conventional schematics packages let a bunch of different-named signals be combined, and later separated, by special combining and separating symbols. The user is typically responsible for making sure that the right data is put together and split apart. This manual process of making sure that the right data is put together and split apart is error-prone and is typically awkward enough that it is almost never used.

Conventional hardware description language (HDL) descriptions of hardware are largely replacing schematic-based hardware descriptions. However, the hardware description language (HDL) descriptions of hardware are typically as limited as the most limited schematics-based schematics capture hardware descriptions. The hardware description language (HDL) descriptions of hardware similarly only allow busses to be made up of like-named signals with different bit numbers. Modem computer hardware design is very constrained by these shortcomings in hardware description language (HDL) descriptions of hardware.

The present invention is directed to overcoming, or at least reducing the effects of, one or more of the problems set forth above.

SUMMARY OF THE INVENTION

In one aspect of the present invention, a method is provided, the method comprising collecting related signals capable of having unrelated names into a Krutibus, defining a bus capable of connecting the related signals in a bus definition file in the Krutibus and providing at least one of component declarations of the bus and different uses of the bus in a hardware description language (HDL) circuit description using the bus definition file in the Krutibus. The method also comprises providing a Krutibus preprocessor to read the hardware description language (HDL) circuit description for the at least one of the component declarations of the bus and the different uses of the bus and to generate a hardware description language (HDL) circuit description naming the bus components.

In another aspect of the present invention, a computer-readable, program storage device is provided, encoded with instructions that, when executed by a computer, perform a method, the method comprising collecting related signals capable of having unrelated names into a Krutibus, defining a bus capable of connecting the related signals in a bus definition file in the Krutibus and providing at least one of component declarations of the bus and different uses of the bus in a hardware description language (HDL) circuit description using the bus definition file in the Krutibus. The method also comprises providing a Krutibus preprocessor to read the hardware description language (HDL) circuit description for the at least one of the component declarations of the bus and the different uses of the bus and to generate a hardware description language (HDL) circuit description naming the bus components.

In yet another aspect of the present invention, a computer programmed to perform a method is provided, the method comprising collecting related signals capable of having unrelated names into a Krutibus, defining a bus capable of connecting the related signals in a bus definition file in the Krutibus and providing at least one of component declarations of the bus and different uses of the bus in a hardware description language (HDL) circuit description using the bus definition file in the Krutibus. The method also comprises providing a Krutibus preprocessor to read the hardware description language (HDL) circuit description for the at least one of the component declarations of the bus and the different uses of the bus and to generate a hardware description language (HDL) circuit description naming the bus components.

In another aspect of the present invention, a device is provided, the device comprising a Krutibus capable of having related signals capable of having unrelated names collected therein, a bus definition file in the Krutibus capable of having a bus capable of connecting the related signals defined therein and at least one of component declarations of the bus and different uses of the bus provided in a hardware description language (HDL) circuit description using the bus definition file in the Krutibus. The device also comprises a Krutibus preprocessor provided to read the hardware description language (HDL) circuit description for the at least one of the component declarations of the bus and the different uses of the bus and to generate a hardware description language (HDL) circuit description naming the bus components.

In yet another aspect of the present invention, a device is provided, the device comprising means for collecting related signals capable of having unrelated names into a Krutibus, means for defining a bus capable of connecting the related signals in a bus definition file in the Krutibus and means for providing at least one of component declarations of the bus and different uses of the bus in a hardware description language (HDL) circuit description using the bus definition file in the Krutibus. The device also comprises means for providing a Krutibus preprocessor to read the hardware description language (HDL) circuit description for the at least one of the component declarations of the bus and the different uses of the bus and to generate a hardware description language (HDL) circuit description naming the bus components.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 4–13 schematically illustrate various embodiments of a method and a device according to the present invention.

Figure 1:
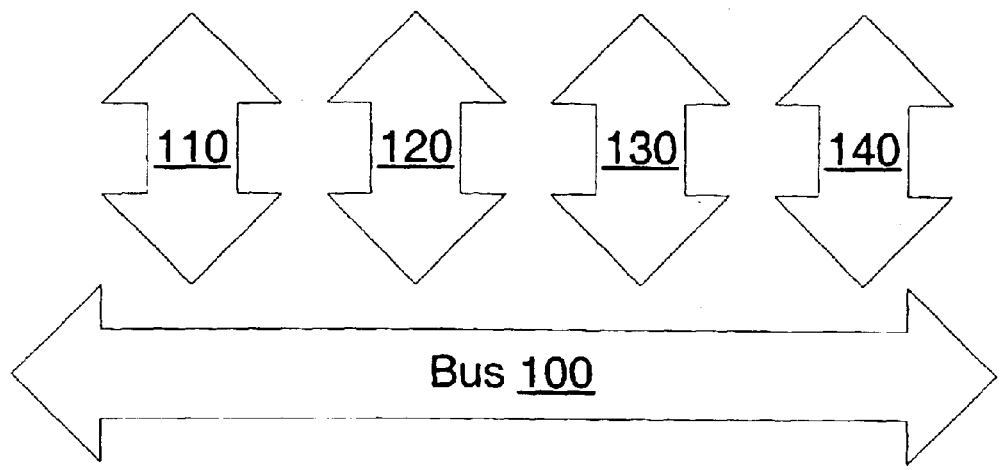
FIG. 1 schematically illustrates a bus having a plurality of inputs and outputs.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
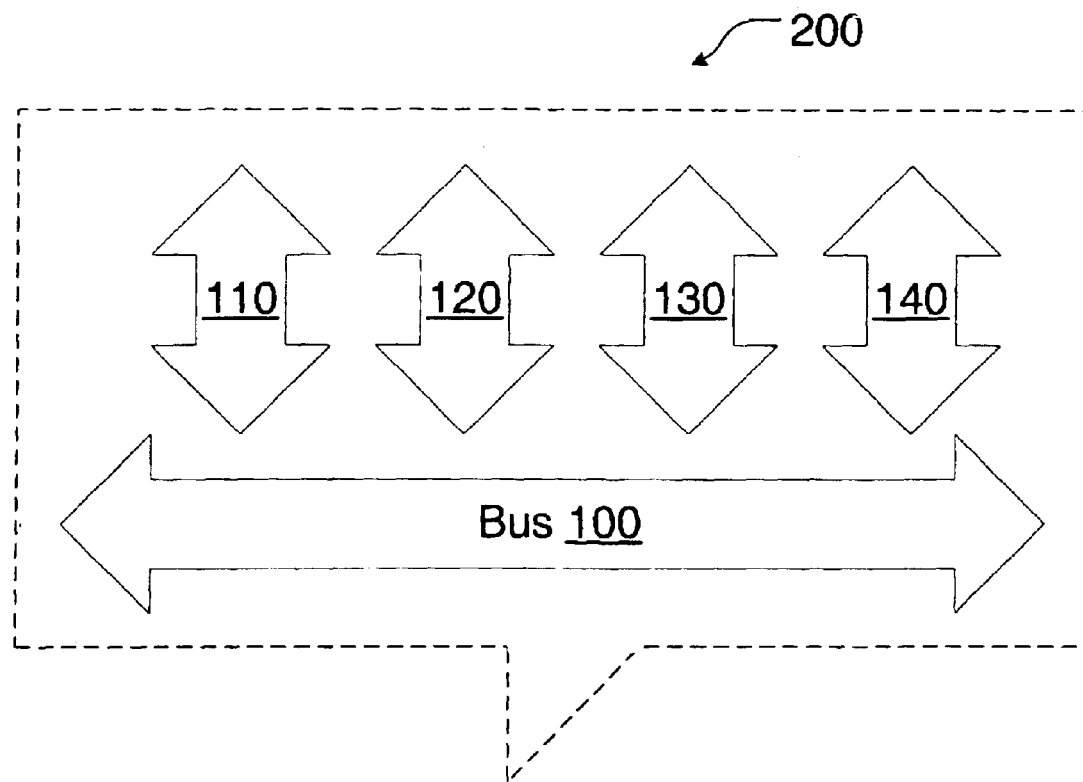
FIG. 2 schematically illustrates a "Krutibus" describing the bus shown in FIG. 1, according to various exemplary embodiments of the present invention.
Figure 3:
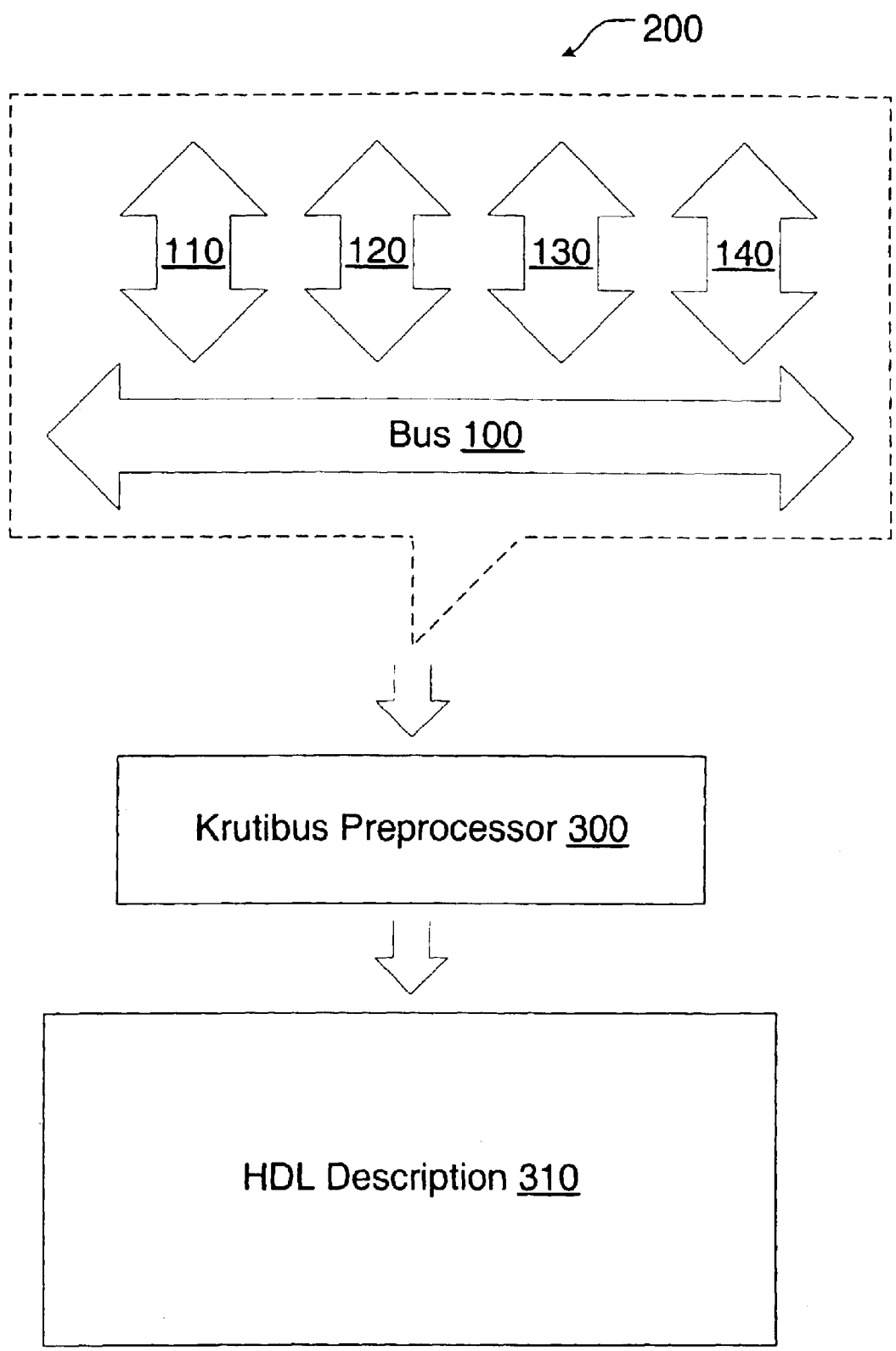
FIG. 3 schematically illustrates a "Krutibus preprocessor" capable of preprocessing the Krutibus shown in FIG. 2, according to various exemplary embodiments of the present invention.

Illustrative embodiments of a method and a device according to the present invention are shown in FIGS. 1–13. As shown in FIGS. 1–3, "Krutibus" technology may be used to provide a compact and convenient description of a number of related signals 110, 120, 130 and 140 that should be considered as a single engineering object. The single engineering object may be the inputs and/or outputs 110, 120, 130 and 140 for a bus 100, as shown in FIG. 1, for example. These related signals 110, 120, 130 and 140 do not need to have the same, or even related, names.

An appropriate hardware description language (HDL) description for the bus 100 may be automatically composed and/or decomposed from a Krutibus description 200, as shown in FIG. 2, by a Krutibus preprocessor or tool 300, as shown in FIG. 3, as needed during development of a chip, for example. The corresponding associated low-level hardware description language (HDL) description 310, such as a Verilog description, may be inserted into the hardware description language (HDL) description source file (not shown) to allow the Krutibus description 200 and the Krutibus preprocessor 300 interoperate with legacy tools.

Using Krutibus technology in chip designs allows chip developers to make their source files significantly smaller. The number of coding errors in original coding and in large coding changes may be significantly reduced thereby. The final designed chip may be easier to browse and easier to understand throughout the backend tool chain due to the use of Krutibus technology with one or more Krutibus descriptions 200 preprocessed by one or more Krutibus preprocessors 300.

A Krutibus description 200 may be specified in a file that may later be read by the Krutibus preprocessor 300. The Krutibus description 200 specification looks like the following:

```
//***********************************************************
//    flash_bus.vh
//
//        Description:
//            This file defines macros that compose and decompose
//                the External Flash bus.
//
//            In the present design, the Flash shares the DRAM bus.
//
    debussify begin flash bus
//        output [22:0] addr_out;    // driven from flash controller to pads
//        output cs_1_out;
//        output oe_1_out;
//        output wr_1_out;
//        output [7.0]     data_out;
//        output addr_out_oe_1;
//        output cs_out_oe_1;
//        output oe_out_oe_1;
//        output wr_out_oe_1;
//        output data_out_oe_1;
//        input [7:0]     data_in;
//    debussify end flash_bus
//***********************************************************
```

This file describes a bus called the "flash_bus." The flash_bus contains elements or components called "addr_out," "cs_1_out," and the like.

A designer using Krutibus technology is normally not concerned with the names of the bus elements or components. The designer operates on the whole bus at once. These busses, like the "flash_bus" specified above, can be referenced by a single line of text in the hardware description language (HDL) description of the chip. In this case, there would be at least a tenfold reduction in the length of the module declarations, as well as a corresponding reduction is coding errors.

An example of the use of the Krutibus specified above by an engineer is the following:

```
//***********************************************************
//    Example of a Krutibus in use in a source file
//
//    Define Module Interface and Port List
module flash_configure_debug_mux (
        oc_flash_bus,      // debussify flash_bus
        other unrelated stuff
);
//    Declare Module Port Types and Sizes
        inout ['FLASH_BUS_RANGE]  oc_flash_bus  // debussify
dest flash_bus [please confirm "inout"]
//    declarations for other unrelated stuff
//
//    Instantiate Sub-module
submodule sm1 (
        .int_flash_bus (oc_flash_bus)    // debussify flash_bus
);
//    Use bus component:
        debussify begin flash_bus
```

```
//      assign oc_flash_bus)data_in[7:0] = 8'h00;
endmodule
//***************************************************************
```

In this case, the Krutibus called flash_bus is used as an input bus. The line containing "// debussify flash_bus" is understood by the Krutibus preprocessor as a declaration of a set of module ports. The line containing "// debussify dest flash_bus" is understood by the Krutibus preprocessor as a declaration of the types of these module ports.

Different hardware description languages (HDLs) will need different formatting for the information output by the Krutibus preprocessor, as one of ordinary skill in the art, having the benefit of the present disclosure, would appreciate. Most hardware description languages (HDLs) contain the same ideas about wires and modules, so there will not be different information in the output of the Krutibus preprocessor, just different formatting details.

The Krutibus preprocessor may read all of the bus definitions for a chip. The Krutibus preprocessor may then read the hardware description language (HDL) description of the circuit. A special file extension ".vpp" may be used to designate files that the Krutibus preprocessor must read. The Krutibus preprocessor may expand the Krutibus descriptions into the target hardware description language (HDL) representation. The Krutibus preprocessor may then create a new file. A special file extension ".v" may be used to designate the new files that the Krutibus preprocessor creates. This derived file may be given to the normal hardware description language (HDL) tool chain. The derived file may then be operated on by the normal hardware description language (HDL) tool chain.

An example of the results of running the Krutibus preprocessor on the above hardware description language (HDL) description fragment is as follows:

```
//******************************************************************
//     Example of the output of the Krutibus preprocessor
//
//     Define Module Interface and Port List
module flash_configure_debug_mux (
            oc_flash_bus_addr_out,
            oc_flash_bus_cs_1_out,
            oc_flash_bus_oe_1_out,
            oc_flash_bus_wr_1_out,
            oc_flash_bus_data_out,
            oc_flash_bus_addr_out_oe_1,
            oc_flash_bus_cs_out_oe_1,
            oc_flash_bus_oe_out_oe_1,
            oc_flash_bus_wr_out_oe_1,
            oc_flash_bus_data_out_oe_1,
            oc_flash_bus_data_in,
            other unrelated stuff
);
//     Declare Module Port Types and Sizes
            input [22:0] oc_flash_bus_addr_out;    // driven from flash
controller to pads
            input oc_flash_bus_cs_1_out;
            input oc_flash_bus_oe_1_out;
            input oc_flash_bus_wr_1_out;
            input [7:0] oc_flash_bus_data_out;
            input oc_flash_bus_addr_out_oe_1;
            input oc_flash_bus_cs_out_oe_1;
            input oc_flash_bus_oe_out_oe_1;
            input oc_flash_bus_wr_out_oe_1;
            input oc_flash_bus_data_out_oe_1;
            output [7:0] oc_flash_bus_data_in;
//     declarations for other unrelated stuff
//
//     Instantiate Sub-module
submodule sm1 (
            .int_flash_bus_addr_out          (oc_flash_bus_addr_out [22:0])
// driven from flash controller to pads
            .int_flash_bus_cs_1_out          (oc_flash_bus_cs_1_out),
            .int_flash_bus_oe_1_out          (oc_flash_bus_oe_1_out),
            .int_flash_bus_wr_1_out          (oc_flash_bus_wr_1_out),
            .intoc_flash_bus_data_out        (oc_flash_bus_data_out [7:0]),
            .int_flash_bus_addr_out_oe_1     (oc_flash_bus_addr_out_oe_1),
            .int_flash_bus_cs_out_oe_1       (oc_flash_bus_cs_out_oe_1),
            .int_flash_bus_oe_out_oe_1       (oc_flash_bus_oe_out_oe_1),
            .int_flash_bus_wr_out_oe_1       (oc_flash_bus_wr_out_oe_1),
            .int_flash_bus_data_out_oe_1     (oc_flash_bus_data_out_oe_1),
            .int_flash_bus_data_in           (oc_flash_bus_data_in [7:0])
);
//     Use bus component:
            assign oc_flash_bus)data_in[7:0] = 8'h00;
endmodule
//******************************************************************
```

Figure 4:
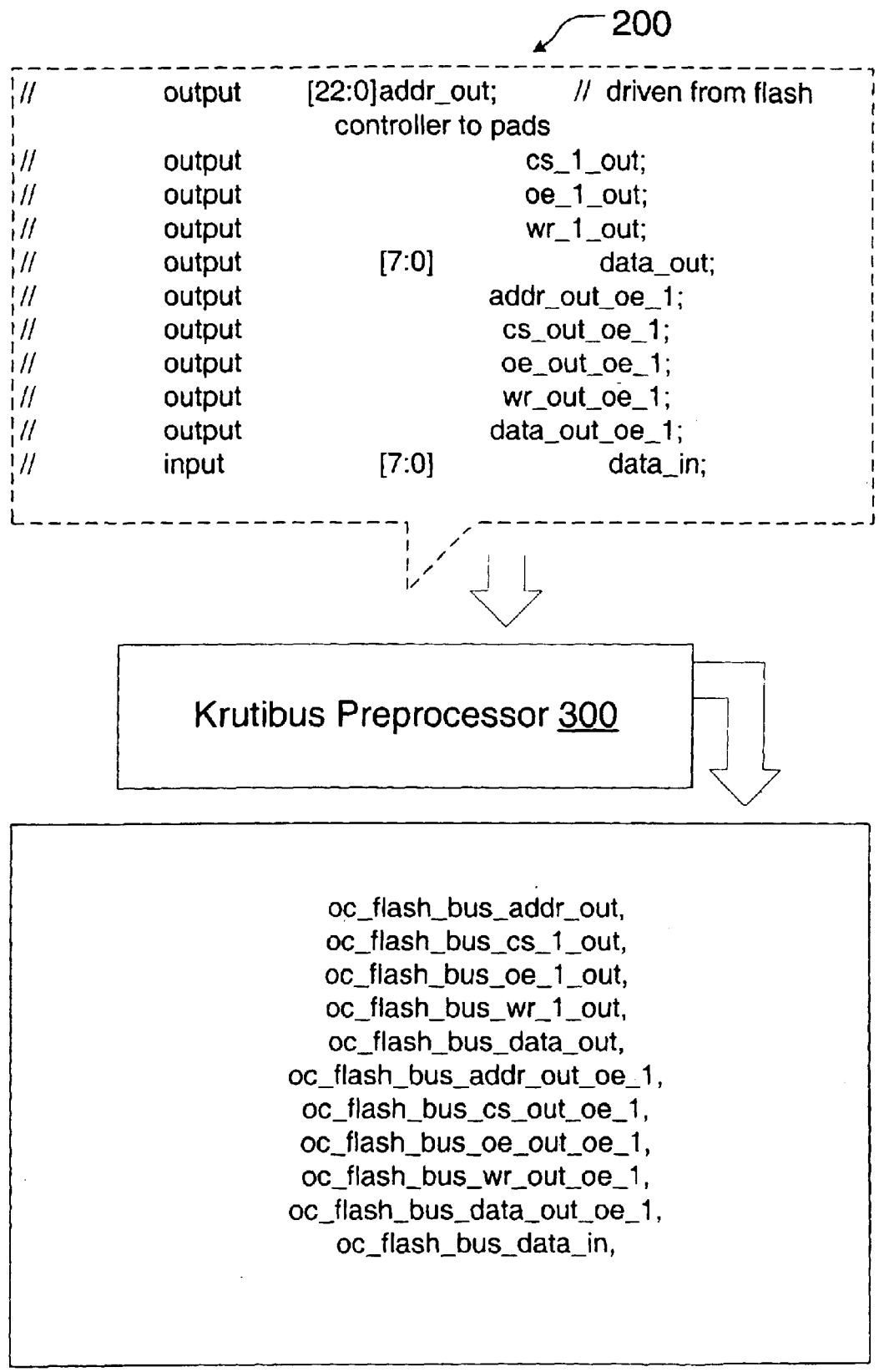

As shown in FIG. 4, the Krutibus description 200 defined with the name "flash-bus" has been expanded into its components in the module declaration 410, with the ports appearing in the same order in which they are defined. Note that each port name has the name of the variable representing the bus in the hardware description language (HDL) description prepended to the name of the bus component in the bus definition, as "port name"+"–"+"bus component name." For example, "oc_flash_bus"+"_"+"addr_out"= "oc_flash_bus_addr_out." This may be done in a variety of ways, depending on the language on which the Krutibus preprocessor 300 is working.

Note also that the declarations of the Module Port Types and Sizes are also expanded, as shown in FIG. 5, in Type Declaration area 510. Each port declaration has the same name as the name generated in the Port list. The Port Size is added by the Krutibus preprocessor 300. Note, too, that in the example given above, all "input" elements in the Krutibus description 200 definition are changed into "output" elements in the Type Declaration area 510. Outputs are changed to inputs, inputs are changed to outputs, and inouts remain the same. This is because the expansion of the Krutibus description 200 specifies that this is a Destination use of the bus 100. This Destination use is specified by using "// debussify dest flash_bus" (where "dest" is short for Destination). If the designer had expanded the declaration using "// debussify src flash_bus" (where "src" is short for Source), the port directions would have been the same as in the Krutibus description 200 declaration.

Figure 6:
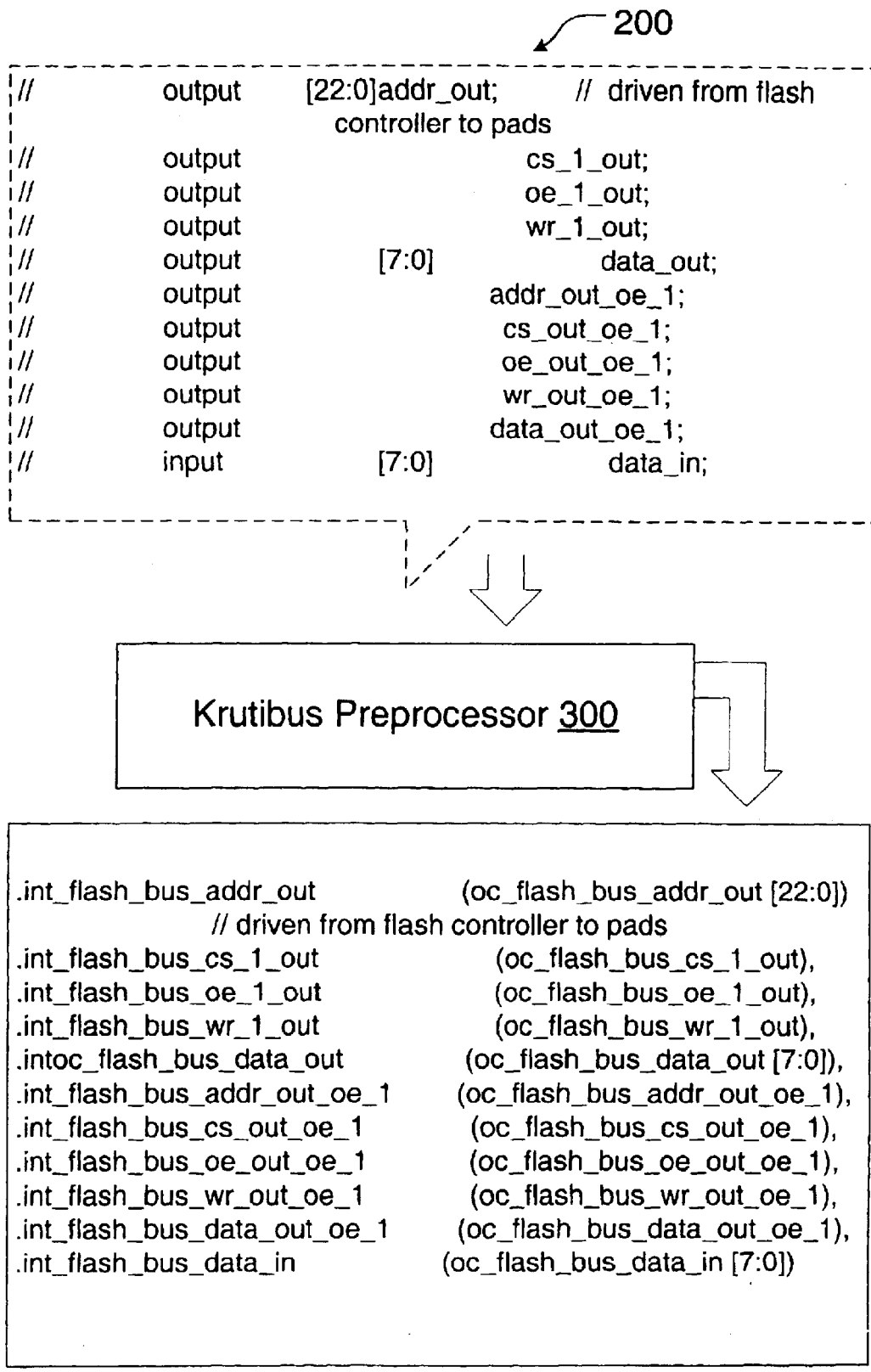

Note that in the instantiation of a sub-module, the ports are expanded by the Krutibus preprocessor 300, as shown in FIG. 6 at 610. In this case, the port name is prepended to the bus component to specify a port attachment, as "."+"port name"+"_"+"bus component name." For example, "."+ "int_flash_bus"+"_"+"addr_out"=".int_flash_bus_ addr_out." This may be done in a variety of ways, as noted above, depending on the language on which the Krutibus preprocessor 300 is working.

Note that in the instantiation of a sub-module, the variables connected to ports are also expanded by the Krutibus preprocessor 300, as also shown at 610 in FIG. 6. In this case, the variable name is prepended to the bus component (with Port Size) to specify a port attachment, as "variable name"+"_"+"bus component name"+"[Port Size]." For example, "oc_flash_bus"+"_"+"addr_out"+"[22:0]"= "oc_flash_bus_addr_out [22:0]." This may be done in a variety of ways, as noted above, depending on the language on which the Krutibus preprocessor 300 is working.

These specific details are specific to the Verilog hardware description language (HDL). The Krutibus technology described herein with respect to various illustrative embodiments is language-independent. The Krutibus description 200 of buses and the Krutibus preprocessor 300 may be used with any hardware description language (HDL). The Krutibus preprocessor 300 will need to be told what the particular hardware description language (HDL) is that the Krutibus preprocessor 300 is preprocessing. The Krutibus preprocessor 300 will then generate the appropriate source language with which to implement the bus 100 in the target language. Note that inside a module, a component of a Krutibus description 200 can be used, and assigned to, using the expanded name generated by the Krutibus preprocessor 300.

For some hardware description languages (HDLs), it is important to know the direction in which a bus is pointing when the bus is used as an argument to a sub-module. This may be done in various illustrative embodiments of the Krutibus technology.

An example of the use of a bus as a destination in a submodule instantiation is the following:

```
//    Instantiate Sub-module
submodule sm1 (
        .int_flash_bus (oc_flash_bus)   // debussify src flash_bus
);
```

Some places in a user's hardware description languages (HDLs) description of a system want to pass only a part of the Krutibus description 200 around as a new bus to other modules. There are a couple of ways to accomplish this. The user might just declare a new bus, for example, "flash_ bus_address_subset," using various illustrative embodiments of the Krutibus technology as described above. However, details of bus components may then be written in two separate places, potentially becoming out-of-date with each other. An alternative way to construct bus subsets is to give extra information in the declarations in the Krutibus description 200. An example of giving extra information in the declarations in the Krutibus description 200 is the following:

```
//************************************************
//    sub-bus example
//    subset names may be any string containing letters, numbers, and "_"
//
//    debussify begin example_bus
//       output [22:0] addr_out;   // #subset_1_name,
#[15:0] subset_4_name
//       output cs_1_out;          // #subset_1_name, #subset_2_name
//       output oe_1_out;          // #subset_1_name, #subset_3_name
//       output wr_1_out;
//    debussify end example_bus
//************************************************
```

When this is done, the Krutibus user can use the bus name "example_bus," as described above. The Krutibus user can also use "example_bus_subset_1_name" to inform the Krutibus preprocessor 300 to only concern itself with lines declared to be members of the subset designated by "subset_1_name." The Krutibus description 200 declaration can also call out a subset of a bus as the word is used in common hardware description language (HDL) declarations. The addr_out Krutibus component described above (in the sub-bus example) declares a sub-bus that only calls out a subset of the wires in the full addr_out bus, as shown in FIGS. 4–6, for example.

The Krutibus preprocessor 300 is capable of running recursively. A Krutibus description 200 of a bus 100 may be declared as a component of another Krutibus description (not shown). In this case, it may be necessary to declare the direction of the Krutibus description 200 of the bus 100 when the Krutibus description 200 of the bus 100 is used in the declaration of another Krutibus description.

In various illustrative embodiments, it may be possible to assign one bus to another bus by writing something like the following:

```
assign bus_b = bus_a    // debussify dir flash_bus
```

The Krutibus preprocessor 300 will expand this to component-by-component assignments. The "dir" argument will specify whether the left-hand side of the assignment will serve as the source or the destination bus. As described above, Destination bus elements will be considered inputs if declared as outputs. Similarly, Destination bus elements will be considered outputs if declared as inputs. Likewise, as described above, Source bus elements will be considered outputs if declared as outputs. Similarly, Source bus elements will be considered inputs if declared as inputs. Inout components will be connected together in a bi-directional way. However, the details of how to do this may be language-dependent. For example, inout components will be connected to the two ports of a "tran" gate.

FIGS. 7–13 schematically illustrate particular embodiments of respective methods 700–1300 practiced in accordance with the present invention. FIGS. 1–6 schematically illustrate various exemplary particular embodiments with which the methods 700–1300 may be practiced. For the sake of clarity, and to further an understanding of the invention, the methods 700–1300 shall be disclosed in the context of the various exemplary particular embodiments shown in FIGS. 1–6. However, the present invention is not so limited and admits wide variation, as is discussed further below.

Figure 7:
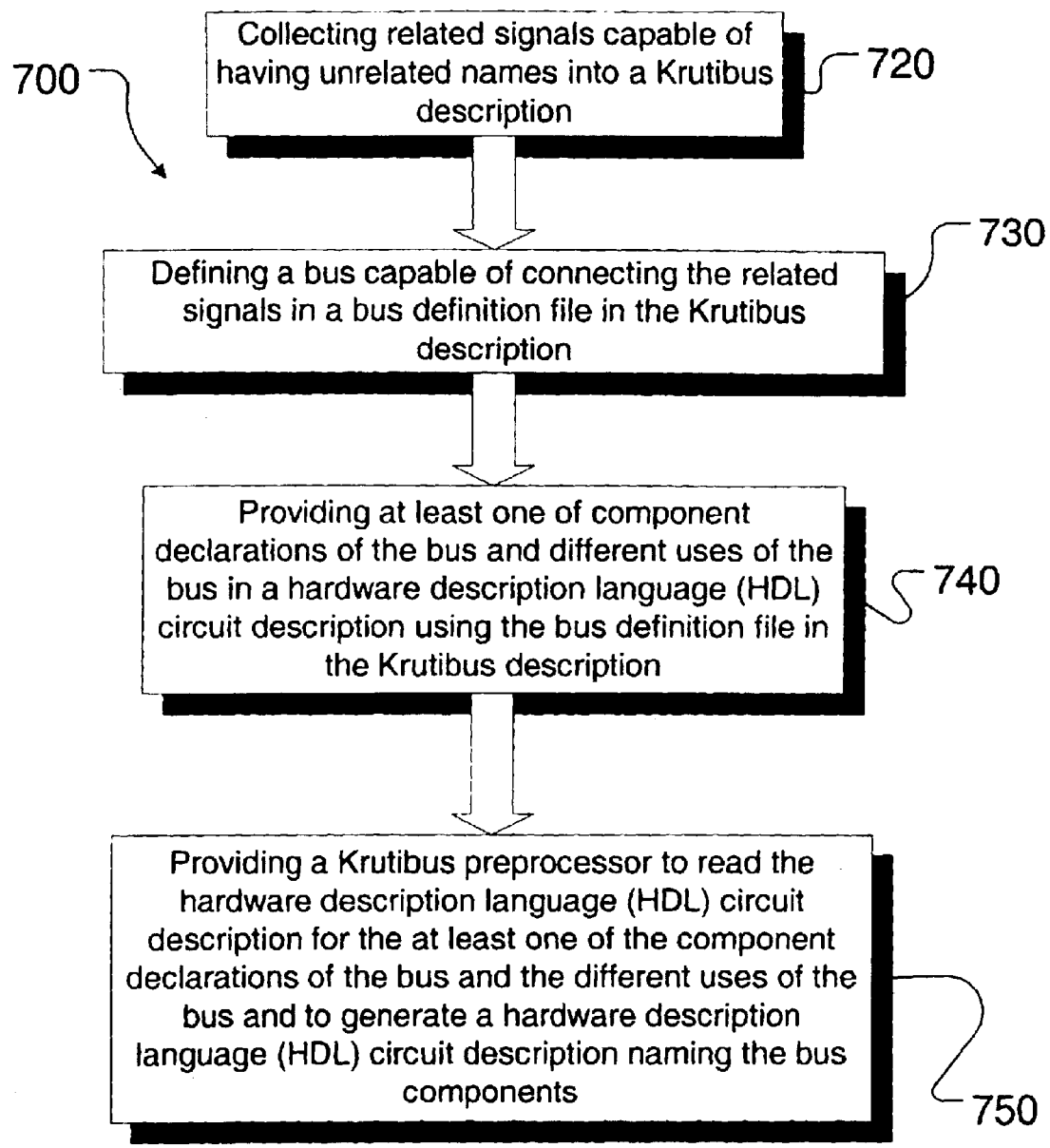

As shown in FIG. 7, the method 700 begins, as set forth in box 720, by collecting related signals capable of having unrelated names into a Krutibus description. For example, as shown in FIG. 2, the related signals 110, 120, 130 and 140 capable of having unrelated names may be collected into the Krutibus description 200. The method 700 proceeds by defining a bus capable of connecting the related signals in a bus definition file in the Krutibus description, as set forth in box 730. For example, as shown in FIG. 4, the Krutibus description 200 may have the bus definition file for the bus named "flash_bus" defined therein.

The method 700 then proceeds, as set forth in box 740, by providing at least one of component declarations of the bus and different uses of the bus in a hardware description language (HDL) circuit description using the bus definition file in the Krutibus description. For example, as shown in FIG. 4, the Krutibus description 200 may have one or more component declarations of the bus named "flash_bus" and/or one or more different uses of the bus named "flash_bus" provided in a hardware description language (HDL) circuit description, using the bus definition file in the Krutibus description 200. The method 700 then proceeds, as set forth in box 750, by providing a Krutibus preprocessor to read the hardware description language (HDL) circuit description for the at least one of the component declarations of the bus and the different uses of the bus and to generate a hardware description language (HDL) circuit description naming the bus components. [Please confirm.]

For example, as shown in FIG. 4 and as described above, the Krutibus description 200 having the bus definition for the bus named "flash_bus" may be expanded by the Krutibus preprocessor 300 into the bus components in the module declaration 410, with the ports appearing in the same order in which they are defined. As described above, each port name may have the name of the variable representing the bus in the hardware description language (HDL) description prepended to the name of the bus component in the bus definition, as "port name"+"_"+"bus component name." For example, "oc_flash_bus"+"_"+"addr_out"="oc_flash_bus_addr_out." This may be done in a variety of ways, depending on the language on which the Krutibus preprocessor 300 is working.

As described above, the declarations of the Module Port Types and Sizes may also be expanded by the Krutibus preprocessor 300, as shown in FIG. 5, in Type Declaration area 510. Each port declaration may have the same name as the name generated in the Port list. The Port Size may be added by the Krutibus preprocessor 300.

As described above, in the instantiation of a sub-module, the ports may be expanded by the Krutibus preprocessor 300, as shown in FIG. 6 at 610. In this case, the port name may be prepended to the bus component to specify a port attachment, as "."+"port name"+"_"+"bus component name." For example, "."+"int_flash_bus"+"_"+"addr_out"=".int_flash_bus_addr_out." This may be done in a variety of ways, as noted above, depending on the language on which the Krutibus preprocessor 300 is working.

As described above, in the instantiation of a sub-module, the variables connected to ports may also be expanded by the Krutibus preprocessor 300, as also shown at 610 in FIG. 6. In this case, the variable name may be prepended to the bus component (with Port Size) to specify a port attachment, as "variable name"+"_"+"bus component name"+"[Port Size]." For example, "oc_flash_bus"+"_"+"addr_out"+"[22:0]"="oc_flash_bus_addr_out [22:0]." This may be done in a variety of ways, as noted above, depending on the language on which the Krutibus preprocessor 300 is working.

As described above, these specific details are specific to the Verilog hardware description language (HDL). The Krutibus technology described herein with respect to various illustrative embodiments is language-independent. The Krutibus description 200 of buses and the Krutibus preprocessor 300 may be used with any hardware description language (HDL).

Figure 8:
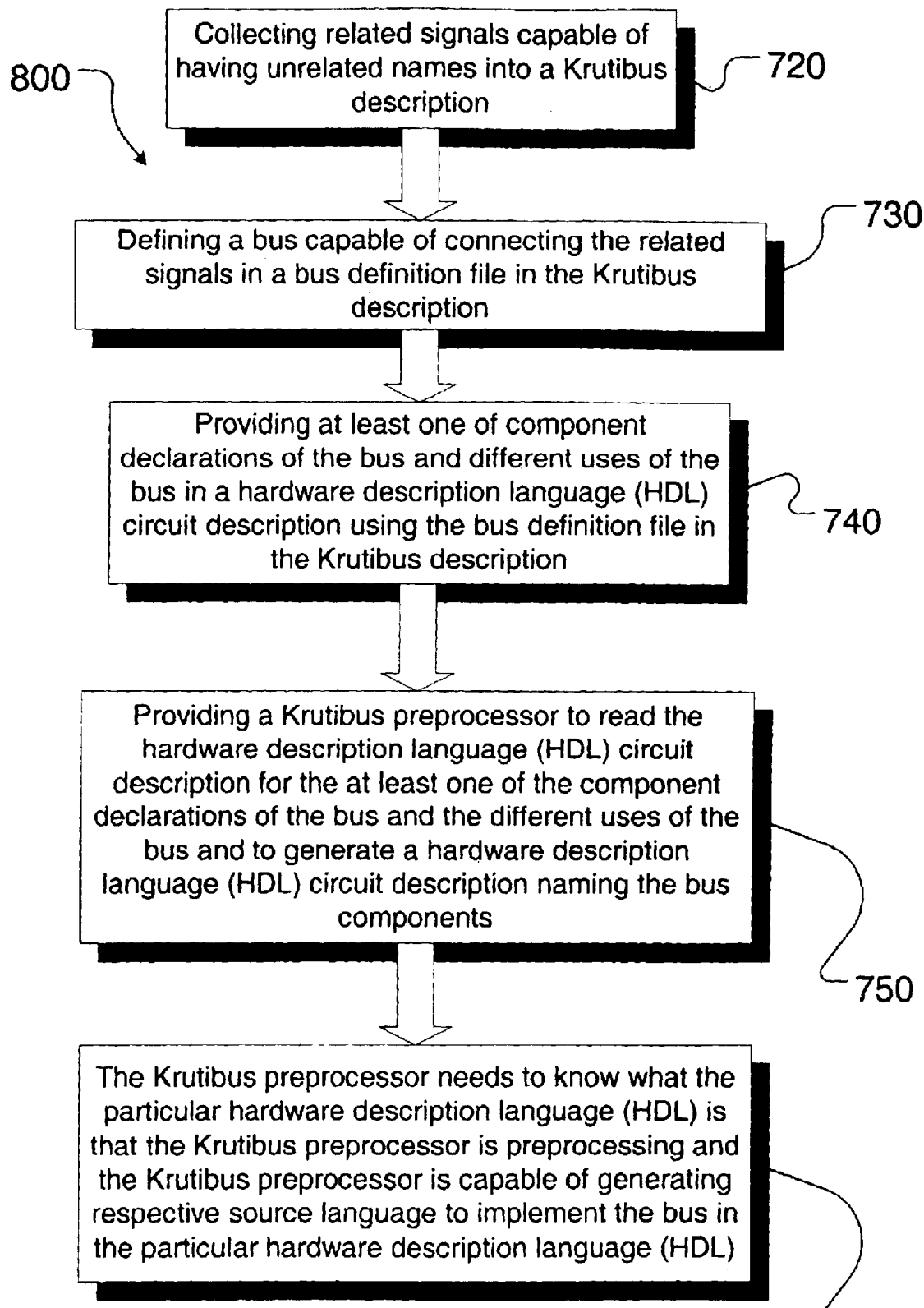

As shown in FIG. 8, the method 800 further provides, in various illustrative embodiments, as set forth in box 860, that the Krutibus preprocessor 300 will need to be told what the particular hardware description language (HDL) is that the Krutibus preprocessor 300 is preprocessing. The Krutibus preprocessor 300 will then generate the appropriate source language with which to implement the bus 100 in the particular hardware description language (HDL) target language. As described above, inside a module, a component of a Krutibus description 200 can be used, and assigned to, using the expanded name generated by the Krutibus preprocessor 300.

Figure 9:
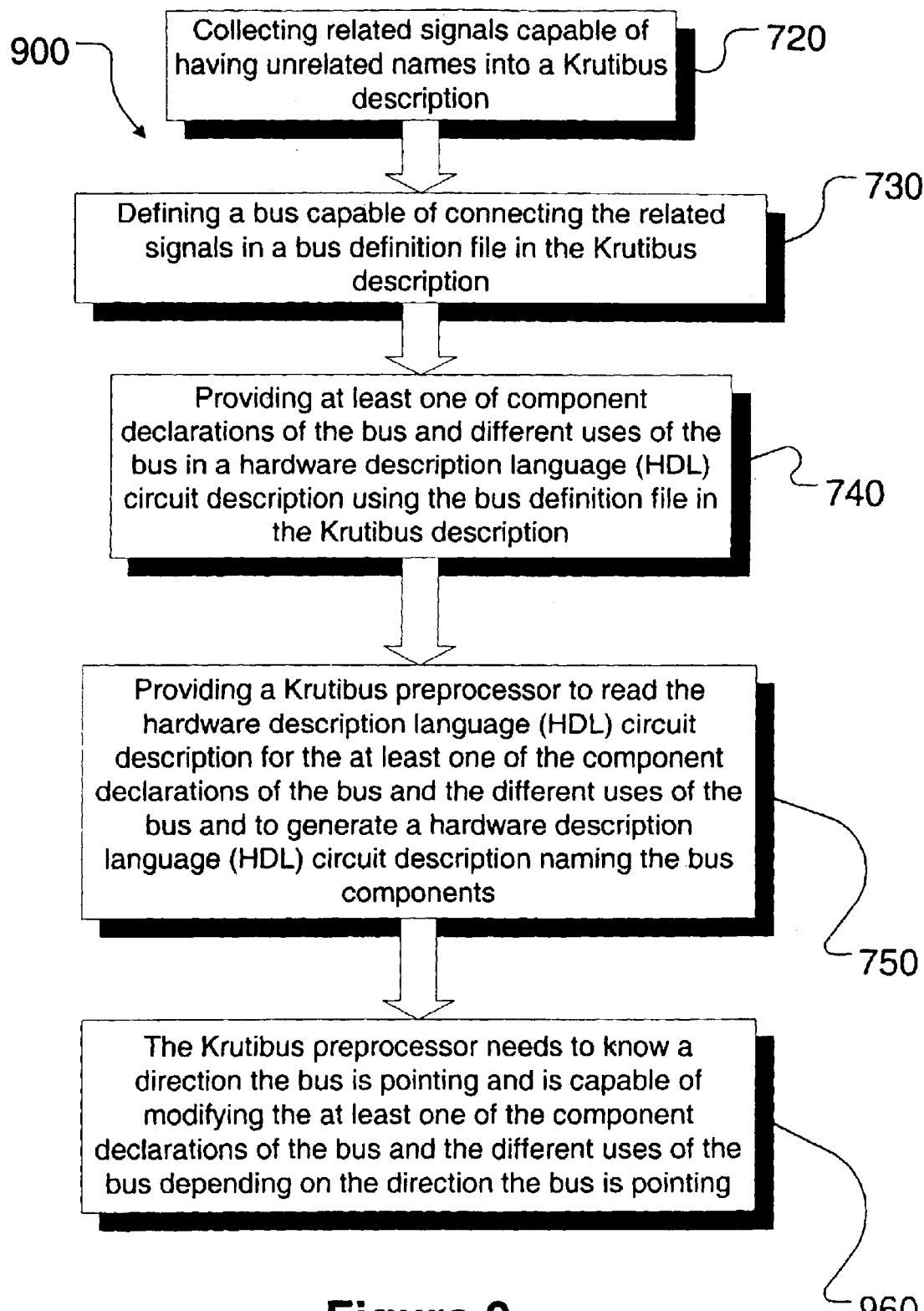

As shown in FIG. 9, the method 900 further provides, in various illustrative 10 embodiments, as set forth in box 960, that the Krutibus preprocessor needs to know a direction the bus is pointing and is capable of modifying the at least one of the component declarations of the bus and the different uses of the bus depending on the direction the bus is pointing. For example, the Krutibus preprocessor 300 may be capable of modifying one or more component declarations of the bus named "flash-bus" and/or one or more different uses of the bus named "flash_bus" by knowing the direction in which the bus named "flash_bus" is pointing. As shown in FIG. 5 and as described above, in the example given above, all "input" elements in the Krutibus description 200 definition may be changed into "output" elements in the Type Declaration area 510. Outputs may be changed to inputs, inputs may be changed to outputs, and inouts may remain the same. This is because the expansion of the Krutibus description 200 specifies that this is a Destination use of the bus 100. This Destination use is specified by using "// debussify dest flash_bus" (where "dest" is short for Destination). If the designer had expanded the declaration using "// debussify src flash_bus" (where "src" is short for Source), the port directions would have been the same as in the Krutibus description 200 declaration.

For some hardware description languages (HDLs), it is important to know the direction in which a bus is pointing when the bus is used as an argument to a sub-module. This may be done in various illustrative embodiments of the Krutibus technology.

Figure 10:
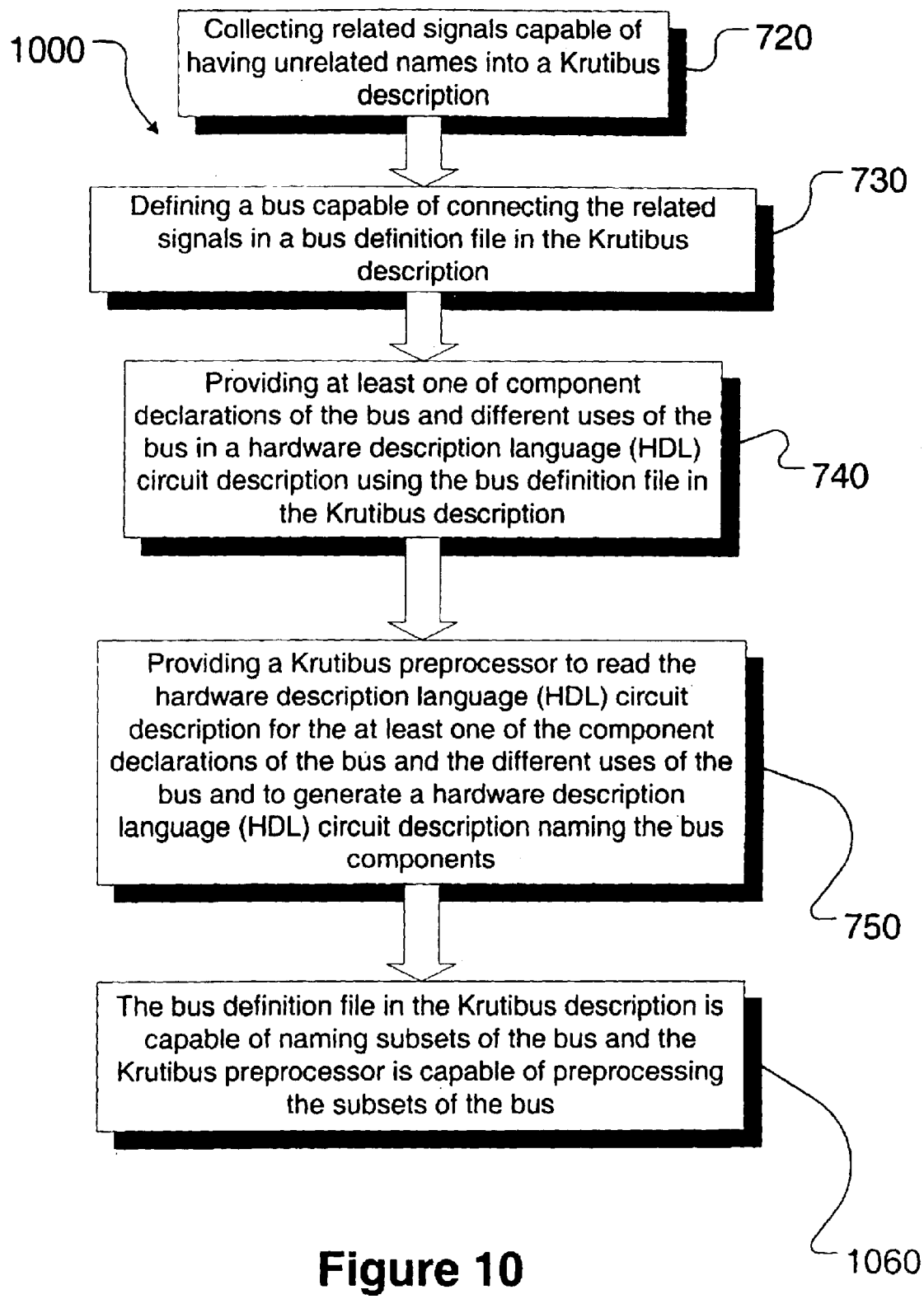

As shown in FIG. 10, the method 1000 further provides, in various illustrative embodiments, as set forth in box 1060, that the bus definition file in the Krutibus description is capable of naming subsets of the bus and the Krutibus preprocessor is capable of preprocessing the subsets of the bus. For example, the bus definition file in the Krutibus description 200 may be capable of naming subsets of the bus 100 and the Krutibus preprocessor 300 may be capable of preprocessing the subsets of the bus 100. For example, in various illustrative embodiments, the user might just declare a new bus, for example, "flash_bus_address_subset," using various illustrative embodiments of the Krutibus technology, as described above. In various alternative illustrative embodiments, extra information to construct the bus 100 subsets may be given in the declarations in the Krutibus description 200. As described above, an example of giving extra information in the declarations in the Krutibus description 200 is the following:

```
//***************************************************************
//   sub-bus example
//   subset names may be any string containing letters, numbers and "_"
//
//   debussify begin example-bus,
//     output [22:0] addr_out;   // #subset_1_name,
#[15:0] subset_4_name
//     output cs_1_out;          // #subset_1_name, #subset_2_name
//     output oe_1_out;          // #subset_1_name, #subset_3_name
//     output wr_1_out;
//   debussify end example_bus
//***************************************************************
```

When this is done, the Krutibus user can use the bus name "example_bus," as described above. The Krutibus user can also use "example_bus_subset_1 name" to inform the Krutibus preprocessor 300 to only concern itself with lines declared to be members of the subset designated by "subset_1_name." The Krutibus description 200 declaration can also call out a subset of a bus as the word is used in common hardware description language (HDL) declarations. The addr_out Krutibus component described above (in the sub-bus example) declares a sub-bus that only calls out a subset of the wires in the full addr_out bus, as shown in FIGS. 4–6, for example.

Figure 11:
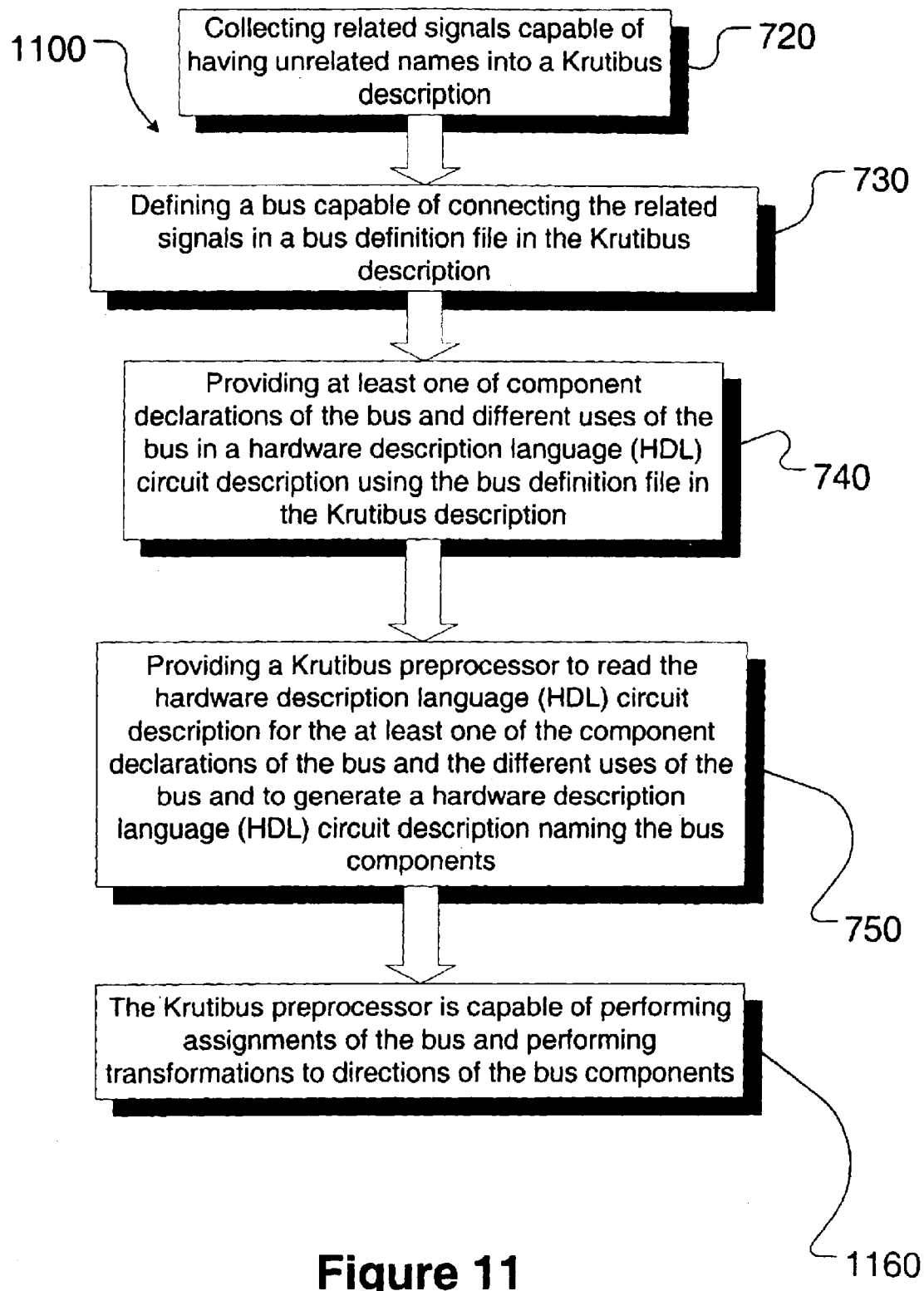

As shown in FIG. 11, the method 1100 further provides, in various illustrative embodiments, as set forth in box 1160, that the Krutibus preprocessor is capable of performing assignments of the bus and performing transformations to directions of the bus components. For example, the Krutibus preprocessor 300 may be capable of performing assignments of the bus 100 and performing transformations to directions of the bus components, as described above and as shown in FIGS. 4–6, for example.

Figure 12:
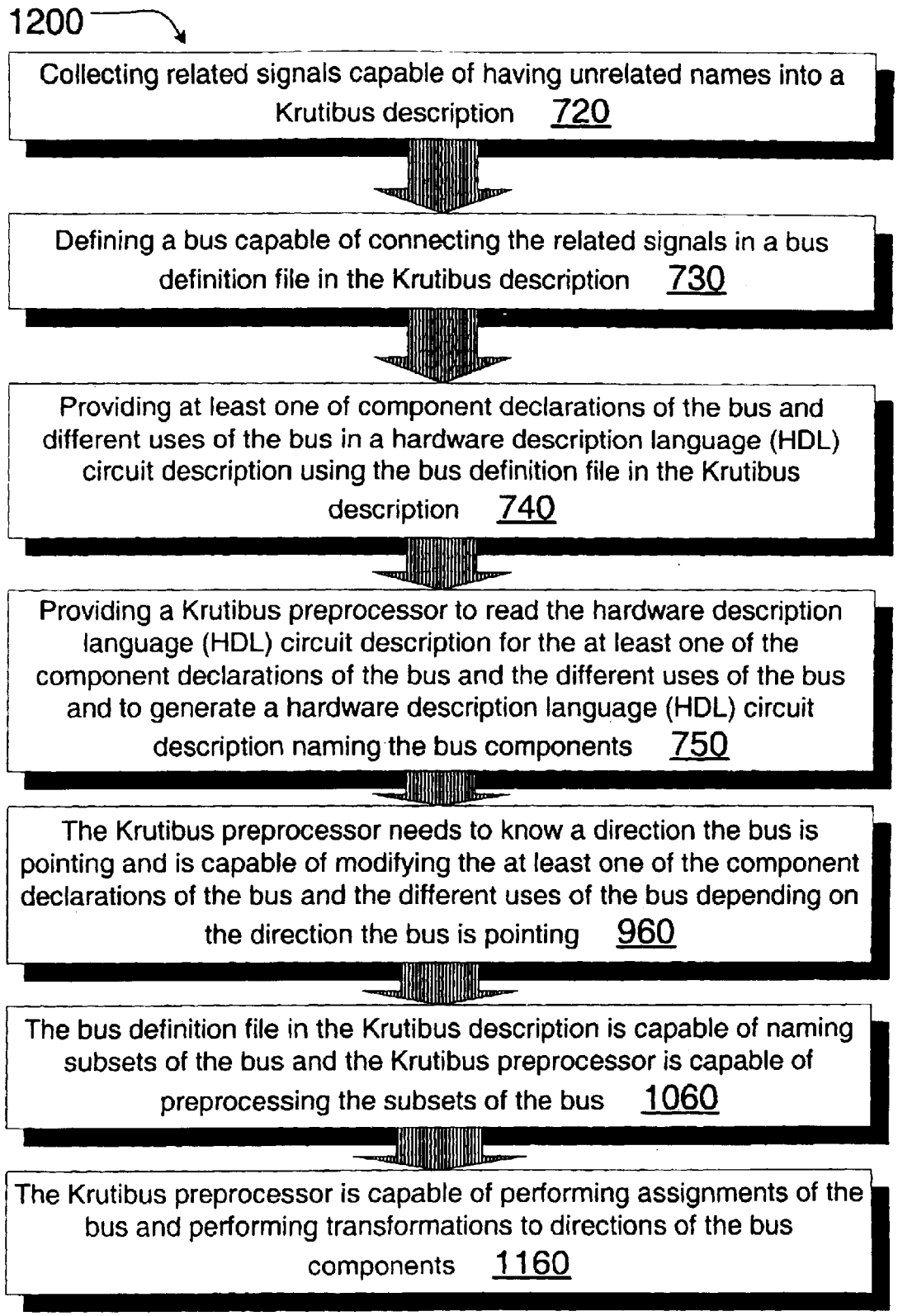

As shown in FIG. 12, the method 1200 further provides, in various illustrative embodiments, as set forth in boxes 960, 1060 and 1160, that: (1) the Krutibus preprocessor needs to know a direction the bus is pointing and is capable of modifying the at least one of the component declarations of the bus and the different uses of the bus depending on the direction the bus is pointing, (2) the bus definition file in the Krutibus description is capable of naming subsets of the bus and the Krutibus preprocessor is capable of preprocessing the subsets of the bus and (3) the Krutibus preprocessor is capable of performing assignments of the bus and performing transformations to directions of the bus components. As shown in FIG. 13, the method 1300 further provides, in various illustrative embodiments, as set forth in boxes 860, 960, 1060 and 1160, that: (1) the Krutibus preprocessor will need to be told what the particular hardware description language (HDL) is that the Krutibus preprocessor is preprocessing and will then generate the appropriate source language with which to implement the bus 100 in the particular hardware description language (HDL) target language, (2) the Krutibus preprocessor needs to know a direction the bus is pointing and is capable of modifying the at least one of the component declarations of the bus and the different uses of the bus depending on the direction the bus is pointing, (3) the bus definition file in the Krutibus description is capable of naming subsets of the bus and the Krutibus preprocessor is capable of preprocessing the subsets of the bus and (4) the Krutibus preprocessor is capable of performing assignments of the bus and performing transformations to directions of the bus components.

Any of the above-disclosed embodiments of a method and a device according to the present invention enables chip developers to make their source files significantly smaller in chip designs. Additionally, any of the above-disclosed embodiments of a method and a device according to the present invention enables a significant reduction in the number of coding errors in original coding and in large coding changes in chip designs. Furthermore, any of the above-disclosed embodiments of a method and a device according to the present invention enables the final designed chip to browsed more easily and to be understood more easily throughout the backend tool chain due to the use of Krutibus technology with one or more Krutibus descriptions preprocessed by one or more Krutibus preprocessors.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A method comprising:
   collecting related signals capable of having unrelated names into a Krutibus description;
   defining a bus capable of connecting the related signals in a bus definition file in the Krutibus description;
   providing at least one of component declarations of the bus and different uses of the bus in a hardware description language (HDL) circuit description using the bus definition file in the Krutibus description; and
   providing a Krutibus preprocessor to read the hardware description language (HDL) circuit description for the at least one of the component declarations of the bus and the different uses of the bus and to generate a hardware description language (HDL) circuit description naming the bus components.

2. The method of claim 1, wherein the Krutibus preprocessor needs to know what the particular hardware description language (HDL) is that the Krutibus preprocessor is preprocessing and the Krutibus preprocessor is capable of generating respective source language to implement the bus in the particular hardware description language (HDL).

3. The method of claim 1, wherein the Krutibus preprocessor needs to know a direction the bus is pointing and is capable of modifying the at least one of the component declarations of the bus and the different uses of the bus depending on the direction the bus is pointing.

4. The method of claim 1, wherein the bus definition file in the Krutibus description is capable of naming subsets of the bus and the Krutibus preprocessor is capable of preprocessing the subsets of the bus.

5. The method of claim 1, wherein the Krutibus preprocessor is capable of performing assignments of the bus and performing transformations to directions of the bus components.

6. The method of claim 2, wherein the Krutibus preprocessor needs to know a direction the bus is pointing and is capable of modifying the at least one of the component declarations of the bus and the different uses of the bus depending on the direction the bus is pointing.

7. The method of claim 6, wherein the bus definition file in the Krutibus description is capable of naming subsets of the bus and the Krutibus preprocessor is capable of preprocessing the subsets of the bus.

8. The method of claim 7, wherein the Krutibus preprocessor is capable of performing assignments of the bus and performing transformations to directions of the bus components.

9. The method of claim 3, wherein the Krutibus preprocessor needs to know a direction the bus is pointing and is capable of modifying the at least one of the component declarations of the bus and the different uses of the bus depending on the direction the bus is pointing.

10. The method of claim 9, wherein the Krutibus preprocessor is capable of performing assignments of the bus and performing transformations to directions of the bus components.

11. A computer-readable, program storage device, encoded with instructions that, when executed by a computer, perform a method comprising:
collecting related signals capable of having unrelated names into a Krutibus description;
defining a bus capable of connecting the related signals in a bus definition file in the Krutibus description;
providing at least one of component declarations of the bus and different uses of the bus in a hardware description language (HDL) circuit description using the bus definition file in the Krutibus description; and
providing a Krutibus preprocessor to read the hardware description language (HDL) circuit description for the at least one of the component declarations of the bus and the different uses of the bus and to generate a hardware description language (HDL) circuit description naming the bus components.

12. The device of claim 11, wherein the Krutibus preprocessor needs to know what the particular hardware description language (HDL) is that the Krutibus preprocessor is preprocessing and the Krutibus preprocessor is capable of generating respective source language to implement the bus in the particular hardware description language (HDL).

13. The device of claim 11, wherein the Krutibus preprocessor needs to know a direction the bus is pointing and is capable of modifying the at least one of the component declarations of the bus and the different uses of the bus depending on the direction the bus is pointing.

14. The device of claim 11, wherein the bus definition file in the Krutibus description is capable of naming subsets of the bus and the Krutibus preprocessor is capable of preprocessing the subsets of the bus.

15. The device of claim 11, wherein the Krutibus preprocessor is capable of performing assignments of the bus and performing transformations to directions of the bus components.

16. The device of claim 12, wherein the Krutibus preprocessor needs to know a direction the bus is pointing and is capable of modifying the at least one of the component declarations of the bus and the different uses of the bus depending on the direction the bus is pointing.

17. The device of claim 16, wherein the bus definition file in the Krutibus description is capable of naming subsets of the bus and the Krutibus preprocessor is capable of preprocessing the subsets of the bus.

18. The device of claim 17, wherein the Krutibus preprocessor is capable of performing assignments of the bus and performing transformations to directions of the bus components.

19. The device of claim 13, wherein the Krutibus preprocessor needs to know a direction the bus is pointing and is capable of modifying the at least one of the component declarations of the bus and the different uses of the bus depending on the direction the bus is pointing.

20. The device of claim 19, wherein the Krutibus preprocessor is capable of performing assignments of the bus and performing transformations to directions of the bus components.

21. A computer programmed to perform a method comprising:
collecting related signals capable of having unrelated names into a Krutibus description;
defining a bus capable of connecting the related signals in a bus definition file in the Krutibus description;
providing at least one of component declarations of the bus and different uses of the bus in a hardware description language (HDL) circuit description using the bus definition file in the Krutibus description; and
providing a Krutibus preprocessor to read the hardware description language (HDL) circuit description for the at least one of the component declarations of the bus and the different uses of the bus and to generate a hardware description language (HDL) circuit description naming the bus components.

22. The computer of claim 21, wherein the Krutibus preprocessor needs to know what the particular hardware description language (HDL) is that the Krutibus preprocessor is preprocessing and the Krutibus preprocessor is capable of generating respective source language to implement the bus in the particular hardware description language (HDL).

23. The computer of claim 21, wherein the Krutibus preprocessor needs to know a direction the bus is pointing and is capable of modifying the at least one of the component declarations of the bus and the different uses of the bus depending on the direction the bus is pointing.

24. The computer of claim 21, wherein the bus definition file in the Krutibus description is capable of naming subsets of the bus and the Krutibus preprocessor is capable of preprocessing the subsets of the bus.

25. The computer of claim 21, wherein the Krutibus preprocessor is capable of performing assignments of the bus and performing transformations to directions of the bus components.

26. The computer of claim 22, wherein the Krutibus preprocessor needs to know a direction the bus is pointing and is capable of modifying the at least one of the component declarations of the bus and the different uses of the bus depending on the direction the bus is pointing.

27. The computer of claim 26, wherein the bus definition file in the Krutibus description is capable of naming subsets of the bus and the Krutibus preprocessor is capable of preprocessing the subsets of the bus.

28. The computer of claim 27, wherein the Krutibus preprocessor is capable of performing assignments of the bus and performing transformations to directions of the bus components.

29. The computer of claim 23, wherein the Krutibus preprocessor needs to know a direction the bus is pointing and is capable of modifying the at least one of the component declarations of the bus and the different uses of the bus depending on the direction the bus is pointing.

30. The computer of claim 29, wherein the Krutibus preprocessor is capable of performing assignments of the bus and performing transformations to directions of the bus components.

31. A device comprising:
a Krutibus capable of having related signals capable of having unrelated names collected therein;
a bus definition file in the Krutibus capable of having a bus capable of connecting the related signals defined therein
at least one of component declarations of the bus and different uses of the bus provided in a hardware description language (HDL) circuit description using the bus definition file in the Krutibus description; and
a Krutibus preprocessor provided to read the hardware description language (HDL) circuit description for the at least one of the component declarations of the bus and the different uses of the bus and to generate a hardware description language (HDL) circuit description naming the bus components.

32. The device of claim 31, wherein the Krutibus preprocessor needs to know what the particular hardware description language (HDL) is that the Krutibus preprocessor is preprocessing and the Krutibus preprocessor is capable of generating respective source language to implement the bus in the particular hardware description language (HDL).

33. The device of claim 31, wherein the Krutibus preprocessor needs to know a direction the bus is pointing and is capable of modifying the at least one of the component declarations of the bus and the different uses of the bus depending on the direction the bus is pointing.

34. The device of claim 31, wherein the bus definition file in the Krutibus description is capable of naming subsets of the bus and the Krutibus preprocessor is capable of preprocessing the subsets of the bus.

35. The device of claim 31, wherein the Krutibus preprocessor is capable of performing assignments of the bus and performing transformations to directions of the bus components.

36. The device of claim 32, wherein the Krutibus preprocessor needs to know a direction the bus is pointing and is capable of modifying the at least one of the component declarations of the bus and the different uses of the bus depending on the direction the bus is pointing.

37. The device of claim 36, wherein the bus definition file in the Krutibus description is capable of naming subsets of the bus and the Krutibus preprocessor is capable of preprocessing the subsets of the bus.

38. The device of claim 37, wherein the Krutibus preprocessor is capable of performing assignments of the bus and performing transformations to directions of the bus components.

39. The device of claim 33, wherein the Krutibus preprocessor needs to know a direction the bus is pointing and is capable of modifying the at least one of the component declarations of the bus and the different uses of the bus depending on the direction the bus is pointing.

40. The device of claim 39, wherein the Krutibus preprocessor is capable of performing assignments of the bus and performing transformations to directions of the bus components.

41. A device comprising:
means for collecting related signals capable of having unrelated names into a Krutibus description;
means for defining a bus capable of connecting the related signals in a bus definition file in the Krutibus description;
means for providing at least one of component declarations of the bus and different uses of the bus in a hardware description language (HDL) circuit description using the bus definition file in the Krutibus description; and
means for providing a Krutibus preprocessor to read the hardware description language (HDL) circuit description for the at least one of the component declarations of the bus and the different uses of the bus and to generate a hardware description language (HDL) circuit description naming the bus components.

42. The device of claim 41, wherein the Krutibus preprocessor needs to know what the particular hardware description language (HDL) is that the Krutibus preprocessor is preprocessing and the Krutibus preprocessor is capable of generating respective source language to implement the bus in the particular hardware description language (HDL).

43. The device of claim 41, wherein the Krutibus preprocessor needs to know a direction the bus is pointing and is capable of modifying the at least one of the component declarations of the bus and the different uses of the bus depending on the direction the bus is pointing.

44. The device of claim 41, wherein the bus definition file in the Krutibus description is capable of naming subsets of the bus and the Krutibus preprocessor is capable of preprocessing the subsets of the bus.

45. The device of claim 41, wherein the Krutibus preprocessor is capable of performing assignments of the bus and performing transformations to directions of the bus components.

46. The device of claim 42, wherein the Krutibus preprocessor needs to know a direction the bus is pointing and is capable of modifying the at least one of the component declarations of the bus and the different uses of the bus depending on the direction the bus is pointing.

47. The device of claim 46, wherein the bus definition file in the Krutibus description is capable of naming subsets of the bus and the Krutibus preprocessor is capable of preprocessing the subsets of the bus.

48. The device of claim 47, wherein the Krutibus preprocessor is capable of performing assignments of the bus and performing transformations to directions of the bus components.

49. The device of claim 43, wherein the Krutibus preprocessor needs to know a direction the bus is pointing and is capable of modifying the at least one of the component declarations of the bus and the different uses of the bus depending on the direction the bus is pointing.

50. The device of claim 49, wherein the Krutibus preprocessor is capable of performing assignments of the bus and performing transformations to directions of the bus components.

* * * * *